United States Patent [19]
Satoh

[11] Patent Number: 6,016,083
[45] Date of Patent: Jan. 18, 2000

[54] ELECTRONIC CIRCUIT APPARATUS FOR SUPPRESSING ELECTROMAGNETIC RADIATION

[75] Inventor: Shunji Satoh, Tokyo, Japan

[73] Assignee: NEC Corporation, Tokyo, Japan

[21] Appl. No.: 08/919,431

[22] Filed: Aug. 27, 1997

[30]       Foreign Application Priority Data

Aug. 27, 1996  [JP]  Japan .................................. 8-224286

[51] Int. Cl.⁷ ...................................................... H04B 3/28
[52] U.S. Cl. ........................ 333/12; 333/182; 174/35 GC; 361/818
[58] Field of Search .............................. 333/12, 181, 182, 333/185; 361/753, 816, 818; 174/36 GC

[56]             References Cited

U.S. PATENT DOCUMENTS

| 4,384,331 | 5/1983  | Fukuhara et al. ..................... 333/12 X |
| 5,392,197 | 2/1995  | Cuntz et al. ............................ 361/818 |
| 5,473,109 | 12/1995 | Plankl et al. ........................ 361/818 X |

FOREIGN PATENT DOCUMENTS

| 3-96297    | 4/1991  | Japan . |
| H3-149899  | 6/1991  | Japan . |
| 3-195092   | 8/1991  | Japan . |
| 4-302492   | 10/1992 | Japan . |
| H4-113492  | 10/1992 | Japan . |
| H5-327266  | 12/1993 | Japan . |

*Primary Examiner*—Justin P. Bettendorf
*Attorney, Agent, or Firm*—Scully, Scott, Murphy & Presser

[57]             ABSTRACT

It is the object of the invention to suppress electromagnetic radiation caused by the ground potential of a printed-circuit board, which now becomes an important problem, as the bit-rate of digital signals increases. The ground-pattern of an electronic circuit mounted on the printed-circuit board is connected to the shield-case of an electronic circuit apparatus via a conductor-piece, noise generated by the electronic circuit is by-passed, and electromagnetic radiation of noise from a cable connected to the printed-circuit board via a connector can be suppressed.

6 Claims, 7 Drawing Sheets

FIG.4A PRIOR ARTS
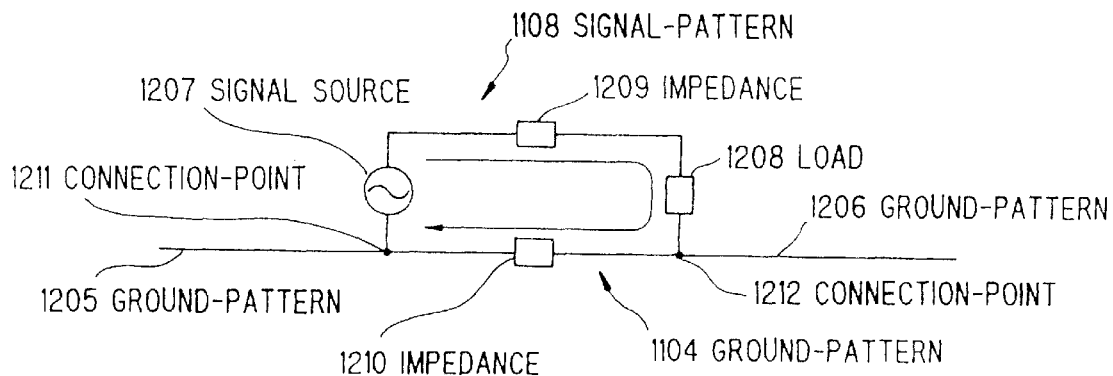
FIG.4B
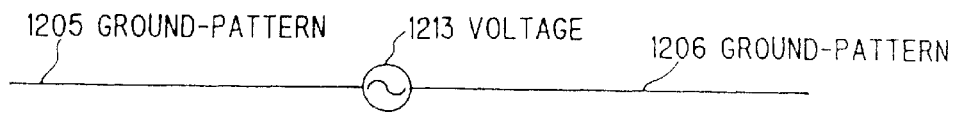
FIG.5 PRIOR ART
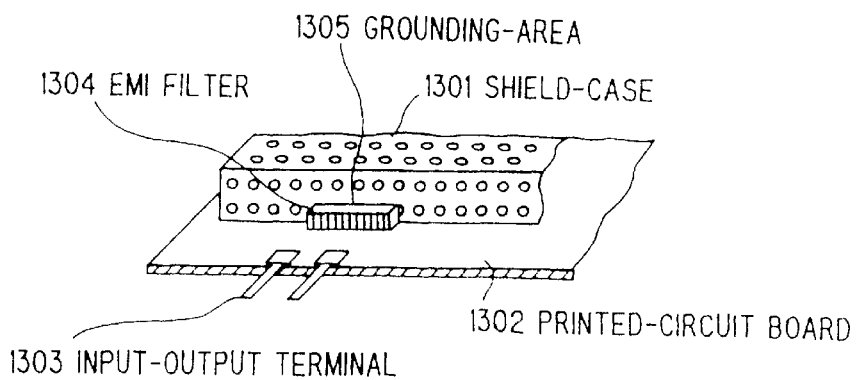

101 : SHIELD-CASE
103 : CONNECTOR
106 : CABLE
107 : ELECTRONIC-CIRCUIT
108,109,110,111 : CONNECTION-POINT
112,113 : ELECTRONIC-PART
201 : GROUND-PATTERN
301 : DISTRIBUTED CAPACITANCE
302,303,304,305,306 : IMPEDANCE
307 : LOAD IMPEDANCE
308,309,310,311 : CURRENT

- 201 GROUND-PATTERN
- 104 CONDUCTOR-PIECE
- 202 GROUND-PATTERN
- 205 SIGNAL-PATTERN
- 203 SIGNAL-PIN
- 204 GROUND-PIN
- 102 PRINTED-CIRCUIT BOARD
- 103 CONNECTOR

101 : SHIELD-CASE
103 : CONNECTOR
106 : CABLE
107 : ELECTRONIC-CIRCUIT
108, 109, 110, 111 : CONNECTION-POINT
112, 113 : ELECTRONIC-PART

201 : GROUND-PATTERN
301 : DISTRIBUTED CAPACITANCE
302, 303, 304, 305, 306 : IMPEDANCE
307 : LOAD IMPEDANCE
308, 309, 310, 311 : CURRENT
601, 602 : THROUGH-CAPACITOR

ELECTRONIC CIRCUIT APPARATUS FOR SUPPRESSING ELECTROMAGNETIC RADIATION

FIELD OF THE INVENTION

This invention relates to an electronic circuit apparatus for suppressing electromagnetic radiation and especially to means for connecting the ground-pattern of the printed-circuit board with the shield-case of the electronic circuit apparatus.

BACKGROUND OF THE INVENTION

The electronic circuit apparatus comprises a printed-circuit board in most cases, which comprises an electronic circuit mounted on its top surface and a ground-pattern stuck to its bottom surface, serving as a common return path of a signal current caused by the electronic circuit. The printed-circuit board is contained in a shield-case, which protects the electronic circuit from external noise and prevents electromagnetic radiation from the printed-circuit board. The printed-circuit board is communicated with an external electronic circuit by a cable, which is fixed to the printed-circuit board via a connector mounted thereon. The dominant component of the impedance of the ground-pattern is an inductive reactance and directly proportional to frequency. On account of recent tendency that the bit-rate of digital signal is remarkably increasing, electromagnetic radiation from the electronic circuit apparatus via the cable connected thereto, which is caused by a voltage between both the ends of the ground-pattern, becomes an important problem. Although considerable numbers of efforts have been made in order to bring this problem to a settlement, further improvement is extremely desirable.

SUMMARY OF THE INVENTION

Accordingly, it is the object of the invention to provide an electronic circuit apparatus for more effectively suppressing electromagnetic radiation by improving a way of connecting the ground-pattern of the printed-circuit board with its shield-case.

According to the feature of the invention, an electronic circuit apparatus for suppressing electromagnetic radiation comprises:

an electronic circuit mounted on a top surface of a printed-circuit board;

a input-output terminal mounted on the printed-circuit board;

a shield-case for suppressing electromagnetic radiation from the electronic circuit;

a conductor-piece allocated between the electronic circuit and the input-output terminal and connecting a first ground-pattern stuck to a bottom surface of the printed-circuit with the shield-case; and means for connecting the first ground-pattern with the input-output terminal via the conductor-piece.

BRIEF DESCRIPTION OF THE DRAWINGS

The invention will be explained in more detail in conjunction with the appended drawings, wherein:

FIGS. 4A to 4B show equivalent circuit diagrams for explaining electromagnetic radiation from a structure shown in FIG. 3, FIG. 5 shows other conventional meas for suppressing electromagnetic radiation from an electronic circuit apparatus.

DESCRIPTION OF THE PREFERRED EMBODIMENTS

Before explaining an electronic circuit apparatus for suppressing electromagnetic radiation in the preferred embodiments, aforementioned conventional means for suppressing electromagnetic radiation from an electronic circuit apparatus will be explained.

On technologies for suppressing undesired electromagnetic radiation from an electronic circuit apparatus comprising a printed-circuit board, serial approaches in the prior art are disclosed in Japanese Patent Kokai Nos. 3-96297, 4-302492 and 3-195092, for example.

Figure 1:
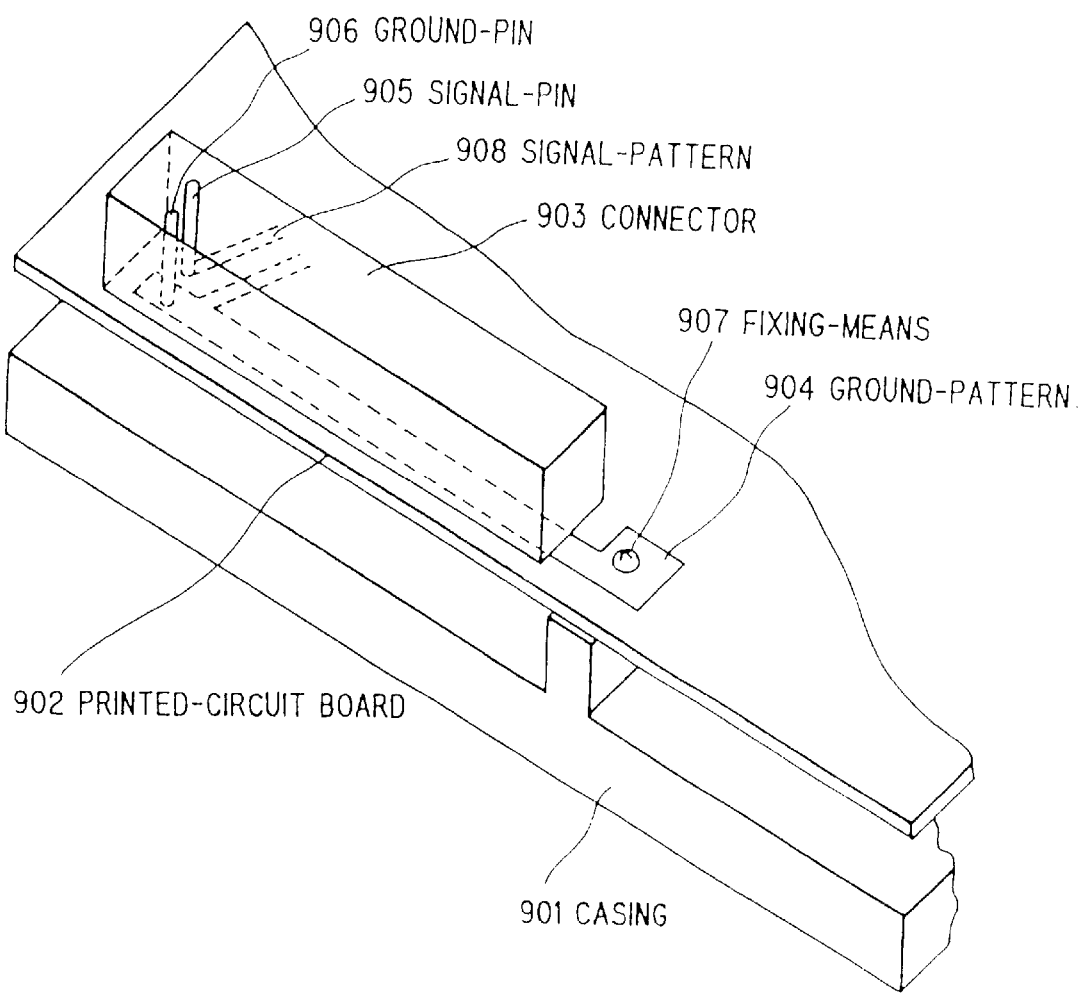
FIG. 1 shows conventional means for suppressing electromagnetic radiation from an electronic circuit apparatus.

FIG. 1 shows means for suppressing electromagnetic radiation from the electronic circuit apparatus comprising the printed-circuit board disclosed in Japanese Patent Kokai No. 3-96297. In this drawing, 901 a casing of the electronic circuit apparatus, 902 is the printed-circuit board mounting an electronic circuit apparatus thereon, 903 is a connector, 905 is the signal-pin of the connector 903, 906 is the ground-pin of the connector 903, 904 is a ground-pattern, 907 is fixing-means for connecting the ground-pattern 904 with the casing 901 and fixing a printed-circuit board 902 to the casing 901, and 908 is a signal-pattern.

Figure 2:
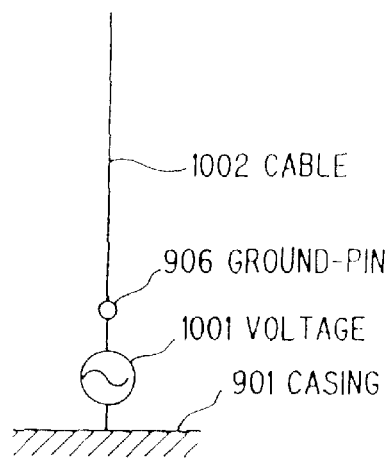
FIG. 2 shows an equivalent circuit diagram for explaining electromagnetic radiation from a structure shown in FIG. 1.

FIG. 2 is an equivalent circuit for explaining electromagnetic radiation form a cable connected to the electronic circuit apparatus. In this drawing, 1001 is a voltage between the ground-pin 906 of the connector 903 and fixing-means 907, which fixes the ground-pattern 904 to the casing 901, and 1002 is a cable connected to the ground-pin 906.

Next, electromagnetic radiation from the cable will be explained referring to FIG. 2. The ground-pattern 904 is connected to the casing 901 by fixing-means 907 in order to decrease the voltage 1001 between the ground-pin 906 and the casing 901. In FIG. 2, electromagnetic radiation from the cable 1002 can be decreased by decreasing the voltage 1001.

Figure 3:
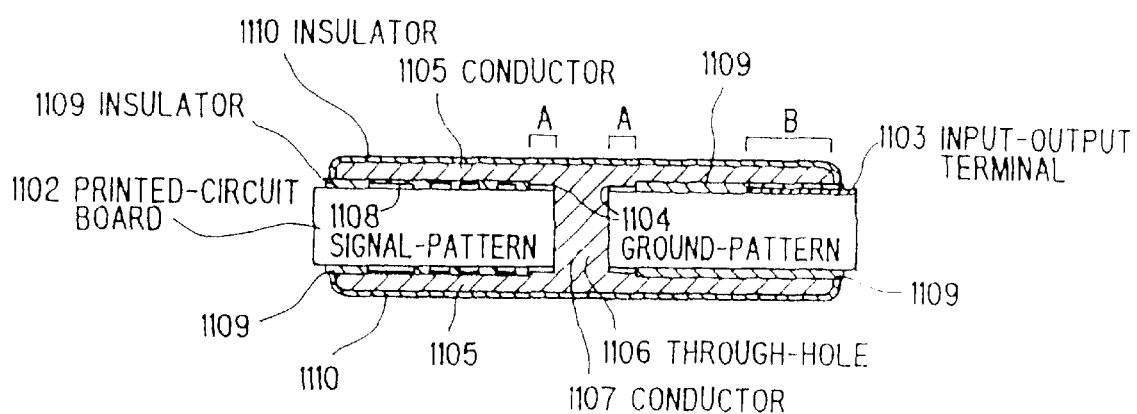
FIG. 3 shows a cross-sectional view of another conventional means for suppressing electromagnetic radiation from an electronic circuit apparatus.

FIG. 3 is a cross-sectional view of another means for suppressing electromagnetic radiation from an electronic circuit apparatus comprising a printed-circuit board disclosed in Japanese Patent Kokai No. 4-302492. In this drawing, 1102 is the printed-circuit board, 1103 is an input-output terminal, 1104 are ground-patterns, and 1500 is a conductor, which is connected to the ground-patterns 1104 at portions A and shields signal patterns 1108. 1106 is a through-hole for connecting the upper conductor 1105 with a lower conductor 1107. 1109 is an insulator for insulating signal patterns 1108 from the conductor 1105.

FIGS. 4A to 4B are equivalent circuits for explaining electromagnetic radiation from the ground-pattern of the printed-circuit board. A terminal of a signal source 1207 is connected to the signal-pattern 1108, and the other terminal of the signal source 1207 is connected to the ground-pattern 1104 at a connection-point 1211. A terminal of a load 1208 is connected to the signal pattern 1108, and the other terminal of the load 1208 is connected to the ground-pattern 1104 at a connection-point 1212. 1209 is an impedance of the signal pattern 1108, 1210 is an impedance of the ground-pattern 1104 between connection-points 1211 and 1212. 1205 is an impedance of a gound pattern with an open end, being connected to the connection-point 1211, and 1206 is the same connected to the connection-point 1212. 1213 is a voltage between both the ends of the impedance 1210 of the ground-pattern 1104. The ground-pattern 1104 is used as a common return path of each circuit, and the ground-patterns 1205 and 1206 with open ends are connected to both the ends of the ground-pattern 1104.

Next, the operation of means for suppressing electromagnetic radiation shown in FIG. 3 will be explained referring to FIGS. 4A to 4B. As shown in FIG. 4B, the ground-patterns 1205 and 1206 operate as an antenna, and radiates electromagnetic wave, being proportional to a voltage 1213. The conductor 1105 has a role to decrease the impedance 1210 of the ground-pattern 1104, too.

FIG. 5 shows the other means for suppressing electromagnetic radiation from an electronic circuit apparatus disclosed in Japanese Patent Kokai No. 3-195092. 1301 is the shield-case of an electronic circuit apparatus and connected to a ground-pattern of the electronic circuit, 1302 is a printed-circuit board, 1303 is an input-output terminal, 1304 is the EMI filter for suppressing electromagnetic radiation, and 1305 is a ground-area of the EMI filter 1304 and connected to the shield-case 1301 at the ground-terminal of the EMI filter 1305.

Next, the operation of means for suppressing electromagnetic radiation shown in FIG. 5 will be explained. Noise generated by the electronic circuit reaches the input-output terminal 1303, after being attenuated by the EMI filter 1304. Since the EMI filter 1304 and the shield-case 1301 form a through-capacitor, an impedance between them becomes very low and suppression of electromagnetic radiation is satisfactory especially in high frequency region. Electromagnetic radiation from the printed-circuit board 1302 is explained by the equivalent circuit shown in FIG. 4 similarly to the case of the structure shown in FIG. 3.

As mentioned in the above, the common defect of the conventional means for suppressing electromagnetic radiation is that, electromagnetic radiation cannot be satisfactorily suppressed, because the impedance of the ground-pattern is not zero and a potential gradient arises along the ground-pattern especially in case that the bit-rate of the digital signal is high.

Next, an embodiment of the invention will be explained referring to the appended drawings.

Figure 6:
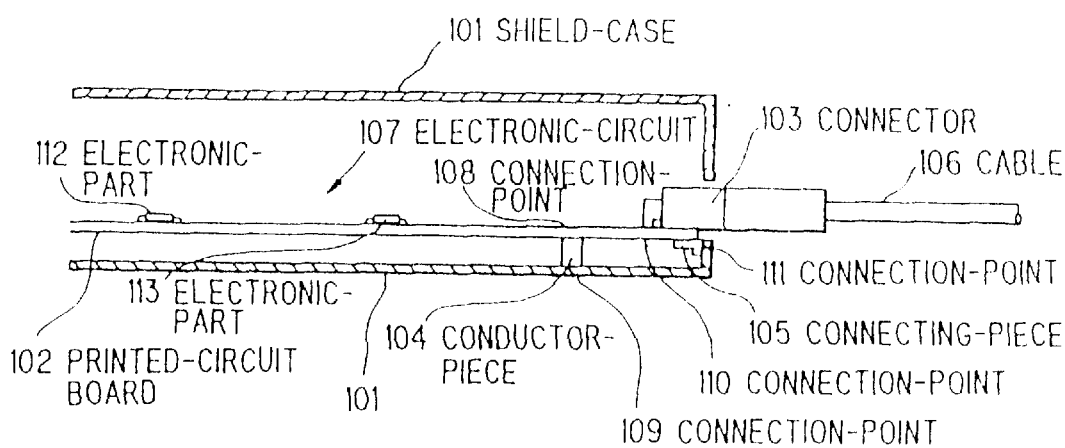
FIG. 6 is a cross-sectional view for showing a first preferred embodiment of the invention on an electronic circuit apparatus for suppressing electromagnetic radiation.

FIG. 6 is a cross-sectional view showing the structure of an electronic circuit apparatus for suppressing electromagnetic radiation, as the first preferred embodiment of the invention. In this structure, a shield-case 101 electromagnetically shields an electronic circuit 107. Electronic parts 112 and 113 are mounted on a printed-circuit board 102. A cable 106 is connected to a printed-circuit board 102 via a connector 103, which serves as an input-output terminal. The ground-pattern (not shown) of the electronic circuit 107, which is stuck to the bottom surface of the printed-circuit board 102, is connected to the shield-case 101 at connection-points 108 and 109 via a conductor-piece 104. On the other hand, the ground-pattern (not shown) of a signal-pattern (not shown), which is stuck to the bottom surface of the printed-circuit board 102, is connected to the shield-case 101 near a position, where the connector 103 is implemented, via a connecting-piece 105. 110 is a point, where the ground-pin of the connector 103 is connected to the ground-pattern of the aforementioned signal-pattern, 111 is a point, where the connecting-piece 105 is connected to the shield-case 101, and both of 112 and 113 are electronic parts of the electronic circuit 107.

Figure 7:
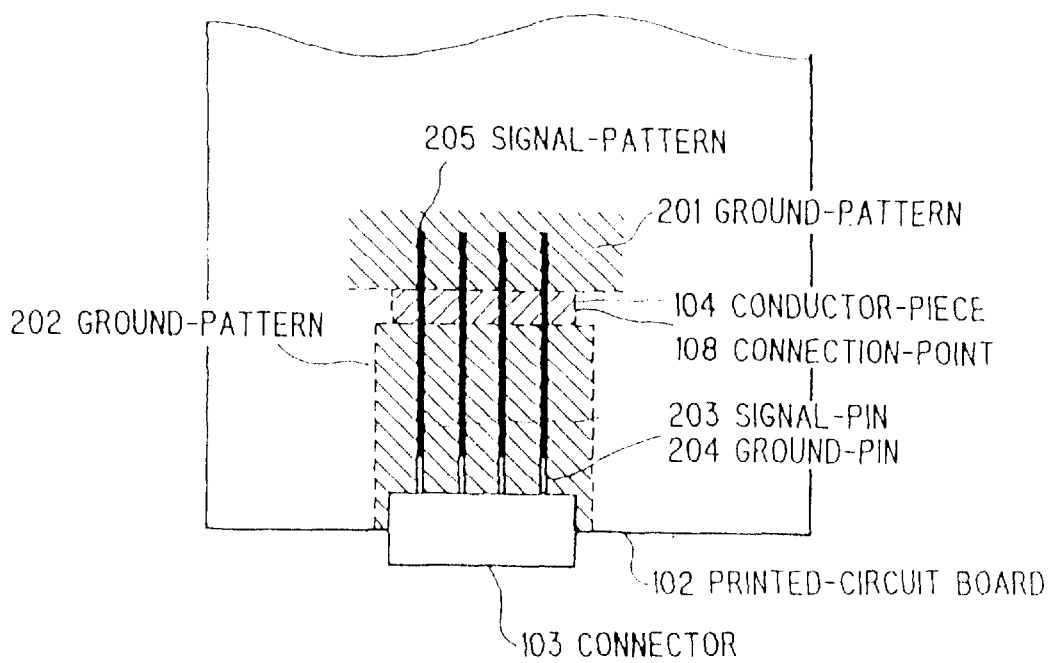
FIG. 7 is the top view of a printed-circuit board near a connector mounted thereon.

FIG. 7 shows the top view of the top surface of the printed-circuit board 102 near its side end. In this drawing, 205 is a signal pattern of the printed-circuit board 102. 203 is the signal-pin of the connector 103, and 204 is the ground-pin of the same, where the signal-pin 203 is above the ground-pin 204, 201 is the ground-pattern of the electronic circuit 107, 202 is the ground-pattern of the signal pattern 205, and 104 is the aforementioned conductor-piece. Although 201, 202 and 104 cannot be directly viewed from a higher position, they are represented by hatched areas. The ground-patterns 201 and 202 are connected with each other at the connection point 108, and not connected at other points. The signal-pin 203 of the connector 103 is connected to the signal pattern 205, and the ground-pin 204 to the ground pattern 202.

Figure 8:
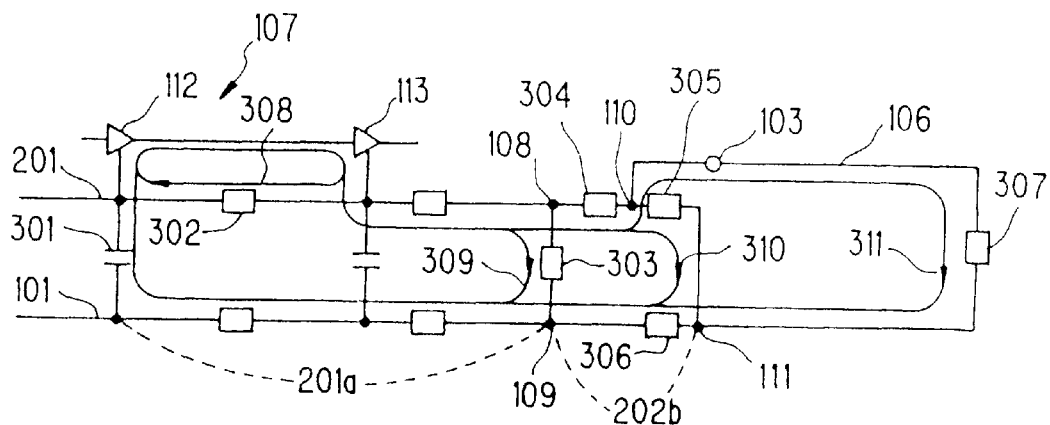
FIG. 8 is an equivalent circuit for explaining the operation of the first preferred embodiment of the invention.

FIG. 8 is an equivalent circuit for explaining the operation of the electronic circuit apparatus for suppressing electromagnetic radiation shown in FIG. 6 as the first preferred embodiment of the invention. In this drawing, a distributed capacitance 301 is that between the ground-pattern 201 of the electronic circuit 107 and the shied-case 101. An impedance 302 is that of the ground-pattern 201 of the electronic circuit 107, an impedance 303 is that of the conductor-piece 104, an impedance 304 is that between the connection-points 108 and 110, an impedance 305 is that between the connection-points 110 and 111, an impedance 306 is that between the connection-points 109 and 111, and an impedance 307 is a terminal impedance of the cable 106. A current 308 is a signal current flowing through the electronic circuit 107, and a current 309 is that generated by the electronic circuit 107 and flowing through the conductor-piece 104 and the distributed capacitance 301. Moreover, a current 310 is that generated by the electronic circuit 107 and flowing through the impedance 304, 305, 306 and the distributed capacitance 301, and a current 311 is that generated by the electronic circuit 107 and flowing through the impedance 304, the cable 106, the impedance 306 and the distributed capacitance 301. Further, sections 201a and 202b represented by broken lines respectively correspond to the regions of ground-patterns 201 and 202.

In FIG. 8, the current 309 arises for the reason that the impedance 302 is not zero. The current 310 arises for the reason that the impedance 303 is not zero. Moreover, the current 311 arises for the reason that both the impedances 305 and 306 are not zero.

Figure 9:
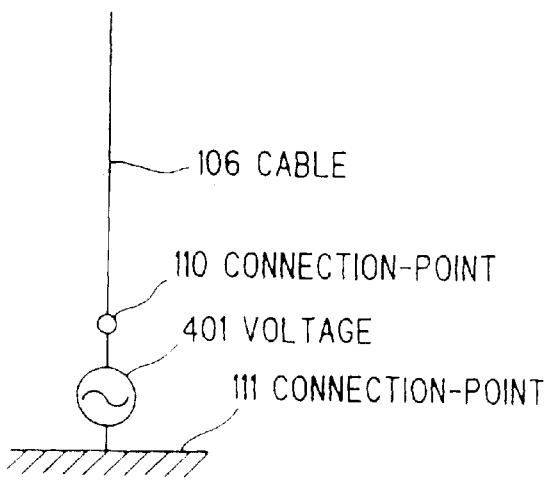
FIG. 9 is an equivalent circuit for explaining electromagnetic radiation from the first preferred embodiment of the invention.

FIG. 9 shows an equivalent circuit for explaining electromagnetic radiation from the cable of the electronic circuit apparatus for suppressing electromagnetic radiation shown as the first preferred embodiment of the invention. 401 is a voltage between both the ends of the impedance 305, namely a voltage between the connection-points 110 and 111.

Figure 10:
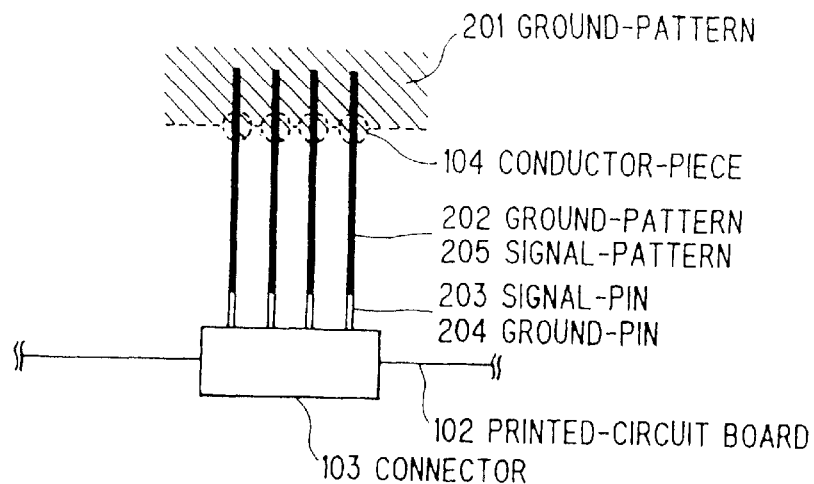
FIG. 10 shows the situation of connection of the printed-circuit board with the shield-case in the first preferred embodiment of the invention.

FIG. 10 shows in detail a way of connecting the ground-pattern with the shield-case near the connector 103 in the electronic circuit apparatus for suppressing electromagnetic radiation shown as the first preferred embodiment of the invention.

There is one to one correspondence between the ground-pattern 202, which connects the ground-pin 204 of the connector 103 with the ground-pattern 201, and the signal pattern 205.

Next, the operation of the equivalent circuit shown in FIG. 8 will be explained. A voltage arises between both the ends of the impedance 302, because the signal current 308 flows through the impedance 302. The current 309 arises by the voltage between both the ends of the impedance 302. A voltage arises between both the ends of the impedance 303, because the current 309 flows through the impedance 303. The current 310 arises by the voltage between both the ends of the impedance 303. A voltage 401 arises between both the ends of the impedance 305, because the current 310 flows through the impedance 305. The current 311 flows through the cable 106 by the voltage 401, and a part of the signal current 308 radiates from the cable 106. A distance between the connection-points 108 and 109 in a straight line is shorter than in a closed circuit passing the connection-points 110 and 111, hence, the impedance thereof is small. Accordingly, the greater part of the current flowing towards the cable 106 is led to the shield-case 101 via the conductor-piece 104 and electromagnetic radiation from the cable is reduced. In the impedance 302 of the ground-pattern 201, its inductive component is dominant, and a voltage between both its ends increases, as the bit-rate of the signal increases. Then, electromagnetic radiation is effectively suppressed by forming a by-pass circuit using the conductor-piece 104. Although a single conductor-piece 104 is used in the circuit structure shown in FIG. 6, further effect can be achieved by arranging plural conductor-pieces in cascade between the electronic circuit 107 and the input-out terminal 103.

Next, the second preferred embodiment will be explained referring to the appended drawing.

Figure 11:
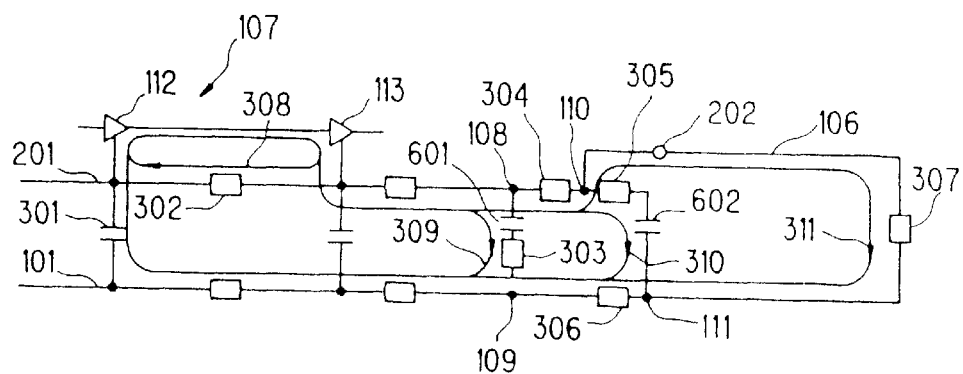
FIG. 11 shows an equivalent circuit diagram of the second preferred embodiment of the invention.

FIG. 11 shows an equivalent circuit of an electronic circuit apparatus for suppressing electromagnetic radiation as the second preferred embodiment of the invention. The physical structure of this embodiment is the same as that shown in FIG. 6 except later mentioned capacitors. In this equivalent circuit, 601 is a capacitor connecting the ground-pattern 201 with the conductor-piece 104 in high frequency region, and 602 is a capacitor connecting the ground-pattern 202 with the connecting-piece 105 in high frequency region. In other words, the function of the electronic circuit apparatus for suppressing electromagnetic radiation corresponding to FIG. 11 is quite the same as that of the apparatus shown in FIG. 6 in high frequency region.

Next, the third preferred embodiment of the invention will be explained in detail referring to the appended drawings.

Figure 12:
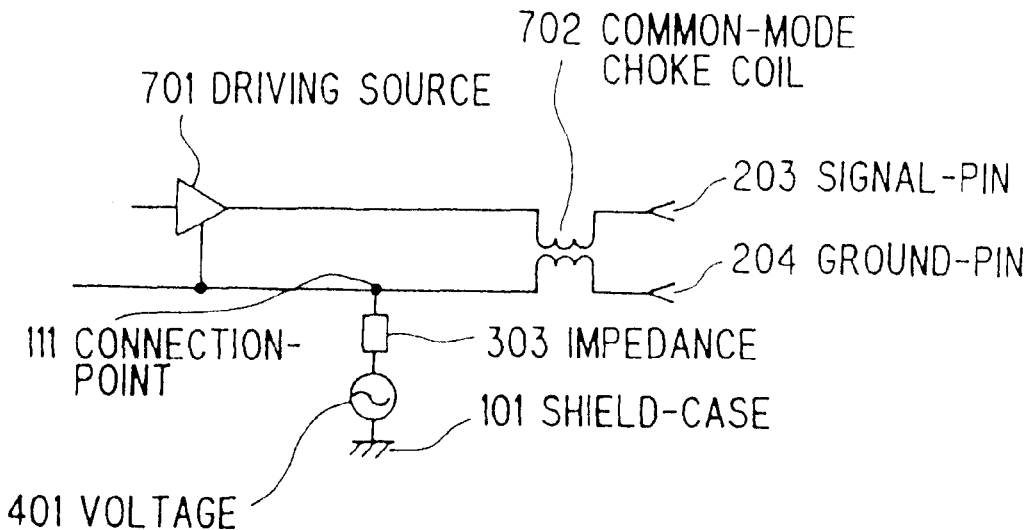
FIG. 12 is a circuit diagram showing the third preferred embodiment of the invention.

FIG. 12 is the circuit diagram of the electronic circuit apparatus for suppressing electromagnetic radiation, shown as the third preferred embodiment. 701 is a driving source for supplying a differential-mode current to the cable 106, and 702 is a common-mode current choke coil for suppressing inflow of the common-mode current into the cable 106, which is caused by the ground potential 401.

Figure 13:
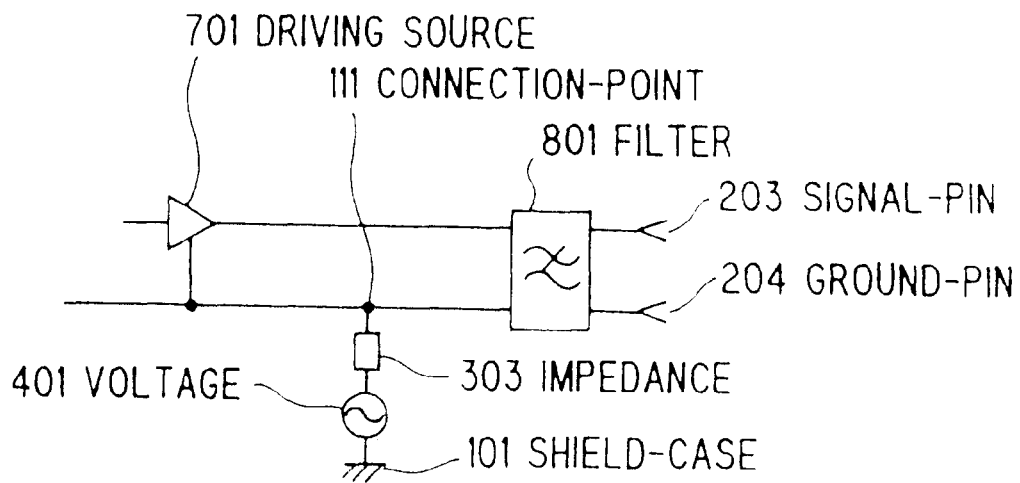
FIG. 13 is a circuit diagram showing a modification of the circuit shown in FIG. 12.

FIG. 13 is the circuit diagram of the electronic circuit apparatus for suppressing electromagnetic radiation, shown as the modification of the embodiment shown in FIG. 12. 801 is a EMI-filter for suppressing inflow of the common-mode current into the cable 106, which is caused by the ground potential 401.

As mentioned in the above, in the electronic circuit apparatus for suppressing electromagnetic radiation according to the invention, a common mode current flowing into the cable is suppressed by setting a conductor-piece between a ground-pattern and a shield-case, and thereby electromagnetic radiation from a cable caused by a common-mode current can be suppressed.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. An electronic circuit apparatus for suppressing electromagnetic radiation comprising:

an electronic circuit mounted on a top surface of a printed-circuit board;

an input-output terminal mounted on said printed-circuit board;

a shield-case for suppressing electromagnetic radiation from said electronic circuit;

a conductor-piece, allocated between said electronic circuit and said input-output terminal and, connecting a first ground-pattern stuck to a bottom surface of said printed-circuit with said shield-case;

means for connecting said first ground-pattern with said input-output terminal via said conductor-piece;

wherein said connecting means is composed of a second ground-pattern stuck to said bottom surface of said printed-circuit board near said input-output terminal and a metallic-connecting-piece for connecting said second ground-pattern with said shield-case.

2. An electronic circuit apparatus for suppressing electromagnetic radiation according to claim 1, wherein the first ground pattern functions as a common return pass for electronic parts of the electronic circuit, and is connected by the conductor piece to a cable.

3. An electronic circuit apparatus for suppressing electromagnetic radiation according to claim 1, wherein:

said input-output terminal is electrically connected with said printed-circuit board only by signal- and ground-pins.

4. An electronic circuit apparatus for suppressing electromagnetic radiation according to claim 1, further comprising a first capacitor inserted between said first ground-pattern and said conductor-piece, and a second capacitor inserted between said second ground-pattern and said metallic-connecting-piece.

5. An electronic circuit apparatus for suppressing electromagnetic radiation according to claim 1, further comprising a four-terminal network for suppressing a common-mode current, being allocated between said input-output terminal and said conductor-piece, wherein:

input-terminals of said four-terminal network are respectively connected to said signal and ground-patterns, and output terminals thereof are respectively connected to two conductors of a cable.

6. An electronic circuit apparatus for suppressing electromagnetic radiation according to claim 1, further comprising a four-terminal network being allocated between said input-output terminal and said conductor-piece, wherein:

input-terminals of said four-terminal network are respectively connected to said signal and ground-patterns, and output-terminal thereof are respectively connected to two conductors of a cable.

* * * * *